US 8,842,061 B2

(12) United States Patent
Chen et al.

(10) Patent No.: US 8,842,061 B2
(45) Date of Patent: Sep. 23, 2014

(54) SHIFTING REGISTER AND APPARATUS FOR DRIVING GATE LINES

(75) Inventors: Xi Chen, Beijing (CN); Wenhai Cui, Beijing (CN)

(73) Assignee: Beijing Boe Optoelectronics Technology Co., Ltd., Beijing (CN)

(*) Notice: Subject to any disclaimer, the term of this patent is extended or adjusted under 35 U.S.C. 154(b) by 206 days.

(21) Appl. No.: 13/439,380

(22) Filed: Apr. 4, 2012

(65) Prior Publication Data

US 2012/0256817 A1    Oct. 11, 2012

(30) Foreign Application Priority Data

Apr. 7, 2011   (CN) .......................... 2011 1 0084499

(51) Int. Cl.
*G09G 3/36*      (2006.01)
*G11C 19/28*     (2006.01)

(52) U.S. Cl.
CPC ........ *G11C 19/28* (2013.01); *G09G 2310/0286* (2013.01); *G09G 3/3674* (2013.01)
USPC ............... 345/92; 345/98; 345/100; 345/204; 377/64

(58) Field of Classification Search
USPC ......... 345/92, 98–100, FOR. 119, FOR. 120, 345/204; 349/42; 365/78–93, 365/189.11–189.12, 240; 377/64–81
See application file for complete search history.

(56) References Cited

U.S. PATENT DOCUMENTS

| | | | |
|---|---|---|---|
| 7,817,771 B2* | 10/2010 | Tsai et al. .................. | 377/64 |
| 2006/0267912 A1* | 11/2006 | Lee et al. .................. | 345/100 |
| 2007/0192659 A1* | 8/2007 | Kang et al. ................ | 714/726 |
| 2008/0187089 A1 | 8/2008 | Miyayama et al. | |
| 2009/0303211 A1 | 12/2009 | Hu | |
| 2010/0245337 A1 | 9/2010 | Hu et al. | |
| 2011/0057926 A1* | 3/2011 | Shang ....................... | 345/213 |
| 2011/0075790 A1* | 3/2011 | Hu ............................ | 377/79 |

FOREIGN PATENT DOCUMENTS

| | | |
|---|---|---|
| CN | 101242178 A | 8/2008 |
| CN | 101546607 A | 9/2009 |
| CN | 101604551 A | 12/2009 |
| CN | 101847445 A | 9/2010 |
| JP | 2010-086640 A | 4/2010 |

OTHER PUBLICATIONS

Extended European Search Report dated Sep. 14, 2012; Appln 12162618.8-1233/2509077.
First Chinese Office Action dated Feb. 11, 2014; Appln. No. 201110084499.5.
KIPO Notice of Allowance of Patent dated Feb. 27, 2014; Appln. No. 10-2012-0035612.

* cited by examiner

*Primary Examiner* — Lun-Yi Lao
*Assistant Examiner* — Elliott Deaderick
(74) *Attorney, Agent, or Firm* — Ladas & Parry LLP (57) ABSTRACT

The present invention discloses a shifting register and an apparatus for driving gate lines, and it relates to Liquid Crystal Display technical field, for reducing the noise of a shifting register during non-working period. The shifting register comprises: a first thin film transistor, a second thin film transistor, a third thin film transistor, a fourth thin film transistor, a capacitor and a pull-down module, and the pull-down module is connected among a clock signal port, a first node and a signal output terminal, and further is connected to a low level signal terminal, for maintaining the first node and the signal output terminal to be at low level during the non-working period of the shifting register. The apparatus for driving gate lines comprises a plurality of above shifting registers connected in serial. The present invention is applicable to driving gate lines.

6 Claims, 10 Drawing Sheets

SHIFTING REGISTER AND APPARATUS FOR DRIVING GATE LINES

FIELD OF INVENTION

The present invention relates to the technical field of liquid crystal displays, in particular, to a shifting register and an apparatus for driving gate lines.

BACKGROUND

A Pixel array of an LCD panel includes a plurality of interleaving row gate lines and column data lines; wherein, the driving of the gate lines can be implemented by an attached integrated driving circuit, and thus it needs to reserve certain areas at the edge of the array substrate of the LCD panel as a bonding area of the integrated driving circuit and a fan-out wiring area for gate lines on the array substrate. Then the integrated driving circuit can be bonded on the array substrate by a flexible printed circuit board COF (Chip on FPC).

It is known that, when gate lines are driven with the integrated driving circuit, two sides of the LCD panel are designed asymmetric because of the need of certain areas reservation at the edge of the array substrate. Further, the bonding operation causes negative effects on production capacity and yield rate. Therefore, an apparatus for driving gate lines (including a plurality of shifting registers in serial) can be integrated on the array substrate with GOA (Gate Driving on Array) technology to realize symmetric design of the LCD panel and high production capacity and yield rate.

Figure 1:
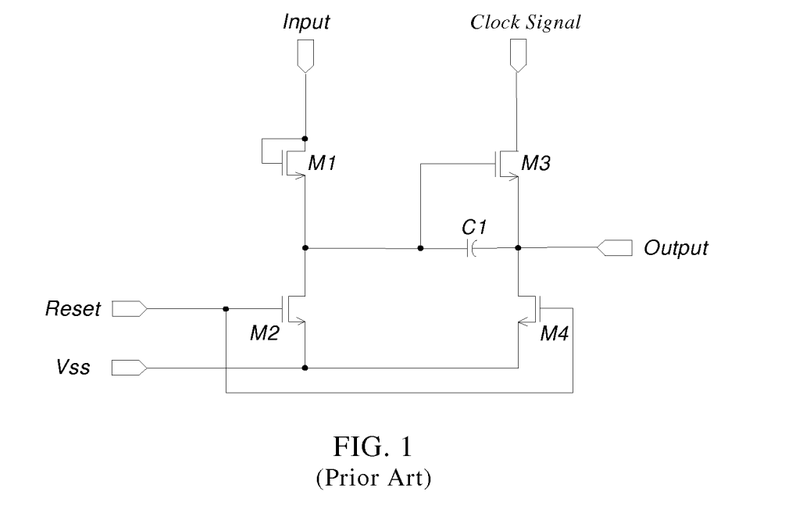
FIG. 1 is a schematic diagram of a shifting register in the prior art.
Figure 2:
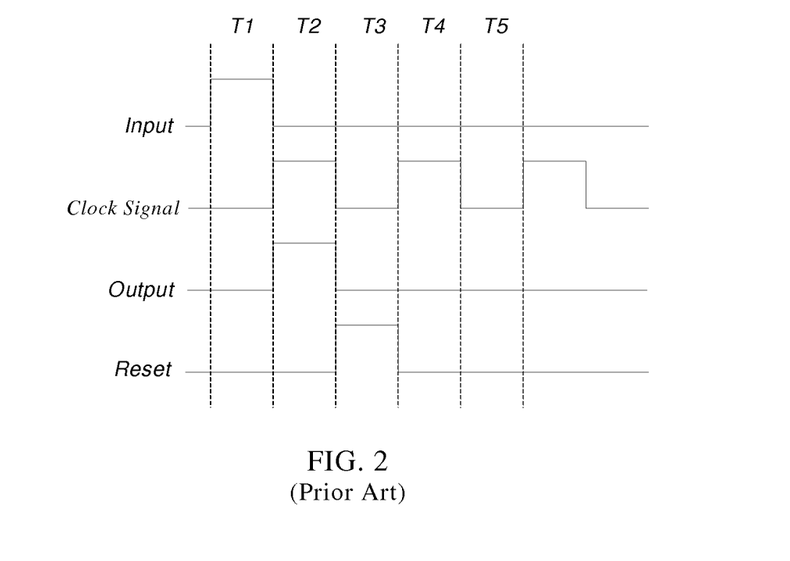
FIG. 2 is a input/output timing chart of the shifting register as shown in FIG. 1.

Currently, a typical shifting register utilizing GOA technology generally includes 4 thin film transistors and a capacitor. FIG. 1 is the schematic diagram of such shifting register, and FIG. 2 is the input and output timing chart of the shifting register as shown in FIG. 1. In combination with FIGS. 1 and 2, it can be seen that the working procedure of the shifting register is as follows with selecting 5 phases of T1 to T5 in FIG. 2: at phase T1, a signal input terminal Input is at high level, a clock signal terminal is at low level, and a reset signal terminal Reset is at low level; at this point, a thin film transistor M1 turns on to charge a capacitor C1, and a thin film transistor M3 turns off so that a low level is output at a signal output terminal Output. At phase T2, the signal input terminal Input is at low level, the clock signal terminal is at high level, and the reset signal terminal Reset is at low level; at this point, the bootstrapping effect of the capacitor C1 further pulls up the gate level of the thin film transistor M3, and the thin film transistor M3 turns on, and the signal output terminal Output outputs a pulse of the clock signal terminal, namely, a high level. At phase T3, the signal input terminal Input is at low level, the clock signal terminal is at low level, and the reset signal terminal is at high level; at this point, thin film transistors M2 and M4 turn on, pulling gate level of the thin film transistor M3 and the level of the signal output terminal Output down to a low level Vss. At phase T4, the signal input terminal Input is at low level, the clock signal terminal is at high level, and the reset signal terminal is at low level; at this point, the thin film transistors M1 to M4 are all off, and the signal output terminal Output outputs a low level. At phase T5, the signal input terminal Input is at low level, the clock signal terminal is at low level, and the reset signal terminal is at low level; at this point, the thin film transistors M1 to M4 are all off, and the signal output terminal Output outputs a low level. Thereafter until next time the signal input terminal Input is at high level, the shifting register repeats phases T4 and T5, during which it can be referred as the non-working period of the shifting register.

It can be seen from the working procedure of the shifting register as above that, the gate of the thin film transistor M3 and the signal output terminal Output are in floating state during the non-working period of the shifting register, and when the clock signal terminal is at high level, a parasitic capacitance of the thin film transistor M3 may cause the leak current thereof to increase, and therefore incurs noise to the signal output terminal Output, leading it to output a high level in error.

SUMMARY

The embodiments of the present invention provide a shifting register and an apparatus for driving gate lines, for reducing the noise of the shifting register during non-working period.

According to one aspect of the present invention, a shifting register is provided, and the shift register comprises:

a first thin film transistor, having the gate and the drain connected together to a signal input terminal, and the source connected to a first node which is a pull up node;

a second thin film transistor, having the gate connected to a reset signal terminal, the drain connected to the first node, and the source connected to a low level signal terminal;

a third thin film transistor, having the gate connected to the first node, the drain connected to a clock signal port, and the source connected to a signal output terminal;

a fourth thin film transistor, having the gate connected to the reset signal terminal, the drain connected to the signal output terminal, and the source connected to the low level signal terminal;

a capacitor, being connected between the first node and the signal output terminal; and Another aspect of the present invention provides an apparatus for driving gate lines, comprising a plurality of shifting registers connected in serial, wherein except for a first shifting register and a last shifting register, each of the rest shifting registers inputs a input trigger signal to the input terminal of the shifting register immediately subsequent to it, and inputs a reset signal to the reset signal terminal of the shifting register immediately previous to it, wherein each of the shifting registers comprises:

Another aspect of the present invention provides an apparatus for driving gate lines, comprising a plurality of shifting registers connected in serial, wherein except for a first shifting register and a last shifting register, each of the rest shifting registers inputs a input trigger signal to the input terminal of the shifting register immediately next to it, and inputs a reset signal to the reset signal terminal of the shifting register immediately previous to it, wherein each of the shifting registers comprises:

a first thin film transistor, having the gate and the drain connected together to a signal input terminal, and the source connected to a first node which is a pull up node;

a second thin film transistor, having the gate connected to a reset signal terminal, the drain connected to the first node, and the source connected to a low level signal terminal;

a third thin film transistor, having the gate connected to the first node, the drain connected to a clock signal port, and the source connected to a signal output terminal;

a fourth thin film transistor, having the gate connected to the reset signal terminal, the drain connected to the signal output terminal, and the source connected to the low level signal terminal;

a capacitor, being connected between the first node and the signal output terminal; and With the shifting register and the apparatus for driving gate lines of embodiments of the present invention, since the pull down module is connected among the clock signal port, the first node and the signal output terminal, and connected to the low level signal terminal, for maintaining the first node and the signal output terminal to be at low level during a non-working period of the shifting register, it is able to prevent the first node and the signal output terminal from being at floating state. In this way, the parasitic capacitance of the third thin film transistor will not cause the leak current to increase when the clock signal port is at a high level, therefore the noise of the shifting register during the non-working period is reduced.

With the shifting register and the apparatus for driving gate lines of embodiments of the present invention, since the pull down module is connected among the clock signal port, the first node and the signal output terminal, and connected to the low level signal terminal, for maintaining the first node and the signal output terminal to be at low level during a non-working period of the shifting register, it is able to prevent the first node and the signal output terminal from being at floating state. In this way, the parasitic capacitance of the third thin film transistor will not cause the leak current to increase when the clock signal port is at a high level, therefore the noise of the shifting transistor during the non-working period is reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

The shifting register and the apparatus for driving gate lines of embodiments of the present invention will be described below in connection with the drawings.

DETAILED DESCRIPTION

The shifting register and the apparatus for driving gate lines of embodiments of the present invention will be described below in connection of the drawings.

It should be clarified that, embodiments described are only a part of embodiments of the present invention, and are not all of embodiments thereof. All of the other embodiments obtained by an ordinary skilled in the art without inventive labor based on the embodiments of the present invention all belong to the claimed scope of the present invention.

Figure 3A:
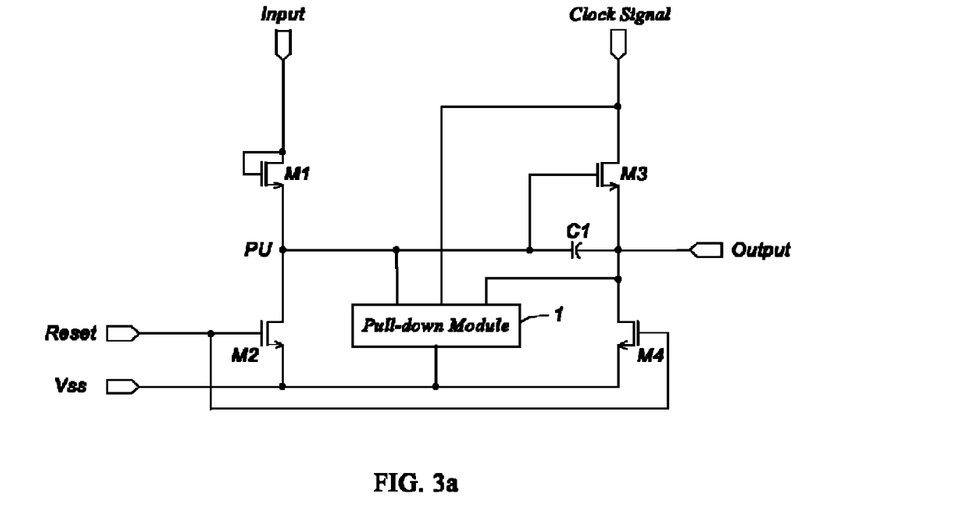
FIG. 3a is a schematic diagram of a shifting register of an embodiment of the present invention.

As in FIG. 3, a schematic diagram of a shifting register of an embodiment of the present invention is shown. The shifting register of the present embodiment includes 4 thin film transistors, a capacitor, a pull-down module and corresponding input and output terminals. It includes the following in detail: a first thin film transistor M1, with the gate and the drain connected together to a signal input terminal Input, and the source connected to a first node PU which is a pull-up node, operates to control the shifting register to start to work when receiving a high level signal sent from the signal input terminal Input; a second thin film transistor M2, with the gate connected to a reset signal terminal Reset, the drain connected to the first node PU, and the source connected to a low level signal terminal Vss, operates to switch on when receiving a high level input from the reset signal terminal Reset, so as to pull down the first node PU to a low level Vss, to prevent a third thin film transistor M3 from switching on in error; the third thin film transistor M3, with the gate connected to the first node PU, the drain connected to a clock signal port, and the source connected to a signal output terminal Output, operates to transmit a high level of the clock signal port to the signal output terminal Output after being switched on, to drive a row of gate lines corresponding to the shifting register to switch on with the high level of the signal output terminal Output; a fourth thin film transistor M4, with the gate connected to the reset signal terminal Reset, the drain connected to the signal output terminal Output, and the source connected to the low level signal terminal Vss, operates to switch on when receiving a high level input from the reset signal terminal Reset, so as to pull down the signal output terminal to a low level Vss, to prevent the shifting register from outputting a high level in error in a resetting phase; a capacitor C1, connected between the first node PU and the signal output terminal Output, forms a storing capacitor; a pull-down module 1, connected among the clock signal port, the first node PU and the signal output terminal Output, and connected to the low level signal terminal Vss, maintains the first node PU and the signal output terminal Output to be at low level during the non-working period of the shifting register.

With the shifting register provided in the embodiment of the present invention, since the pull-down module 1 is connected among the clock signal port, the first node PU and the signal output terminal Output, and connected to the low level signal terminal Vss, to maintain the first node PU and the signal output terminal Output to be at low level during the non-working period of the shifting register, thus it is able to prevent the first node PU and the signal output terminal Output from being in floating state. As such, the parasitic capacitance of the third thin film transistor M3 will not cause its leak current to increase when the clock signal port is at high level, therefore the noise of the shifting register during the non-working period is reduced.

Figure 4:
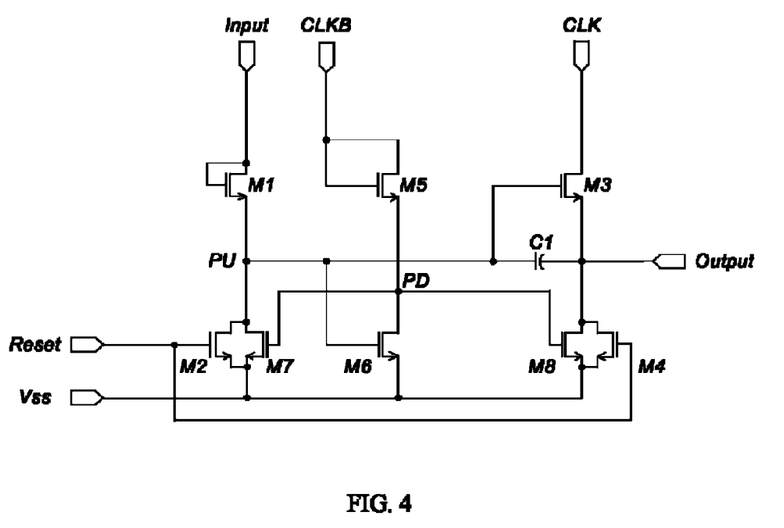
FIG. 4 is a schematic diagram of a detailed implementation of a shifting register of an embodiment of the present invention.

As in FIG. 4, the schematic diagram of one detailed implementation of a shifting register of one embodiment of the present invention is shown. It can be seen from FIG. 4 that, the shifting register includes 8 thin film transistors, a storing capacitor and corresponding input and output terminals. The 8 thin film transistors are: a first thin film transistor M1, a second thin film transistor M2, a third thin film transistor M3, a fourth thin film transistor M4, a fifth thin film transistor M5, a sixth thin film transistor M6, a seventh thin film transistor M7 and a eighth thin film transistor M8. The storing capacitor is capacitor C1. The input and output terminals include: a signal input terminal Input, a signal output terminal Output, a reset signal terminal Reset, a low level signal terminal Vss and a clock signal port, wherein the clock signal port include a first clock signal terminal CLK and a second clock signal terminal CLKB having signal level inverted to each other. When the signal input terminal Input is at high level, the first clock signal terminal CLK is at low level, and the second clock signal terminal CLKB is at high level.

The detailed structure of the shifting register in the present embodiment includes: the first thin film transistor M1, with the gate and the drain connected together to the signal input terminal Input, and the source connected to a first node PU which is a pull-up node; the second thin film transistor M2, with the gate connected to the reset signal terminal Reset, the drain connected to the first node PU, and the source connected to the low level signal terminal Vss; the third thin film transistor M3, with the gate connected to the first node PU, the drain connected to the first clock signal terminal CLK, and the source connected to the signal output terminal Output; the fourth thin film transistor M4, with the gate connected to the reset signal terminal Reset, the drain connected to the signal output terminal Output, and the source connected to the low level signal terminal Vss; the fifth thin film transistor M5, with the gate and the drain connected together to the second clock signal terminal CLKB, the source connected to a second node PD which is a pull-down node; the sixth thin film transistor M6, with the gate connected to the first node PU, the drain connected to the second node PD, and the source connected to the low level signal terminal Vss; the seventh thin film transistor M7, with the gate connected to the second node PD, the drain connected to the first node PU, and the source connected to the low level signal terminal Vss; the eighth thin film transistor M8, with the gate connected to the second node PD, the drain connected to the signal output terminal Output, and the source connected to the low level signal terminal Vss; and the storing capacitor C1, connected between the first node PU and output terminal Output of the same stage.

The fifth thin film transistor M5, the sixth thin film transistor M6, the seventh thin film transistor M7 and the eighth thin film transistor M8 constitute a pull-down module 1 of the present embodiment. The pull-down module 1 is used to maintain the first node PU and the signal output terminal Output to be at low level during the non-working period of the shifting register, therefore it is able to prevent the first node PU and the signal output terminal Output from being in floating state. As such, the parasitic capacitance of the third thin film transistor M3 will not cause the leak current to increase when the clock signal port is at high level, therefore the noise of the shifting register during the non-working period is reduced.

Figure 3B:
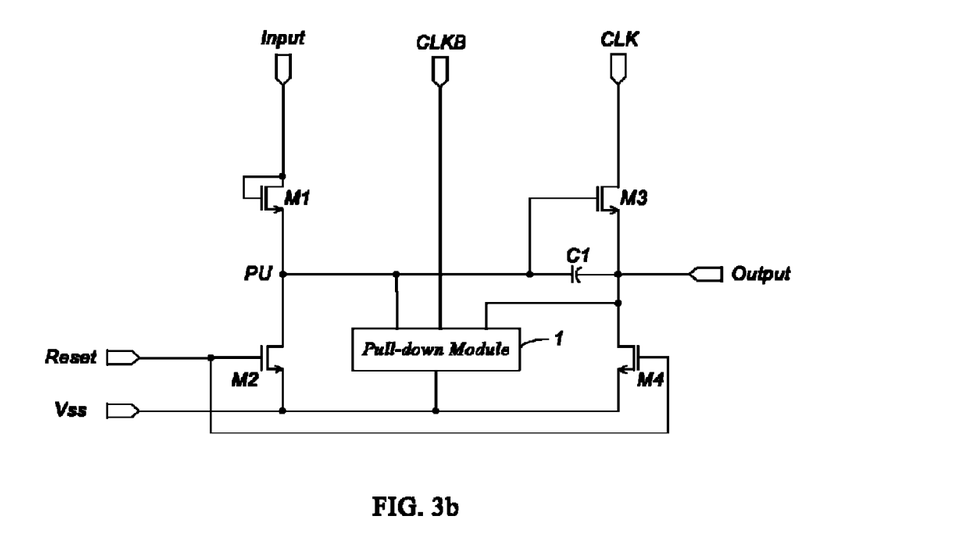
FIG. 3b is the schematic diagram of one implementation of a clock signal port in the shifting register as shown in FIG. 3.
Figure 3C:
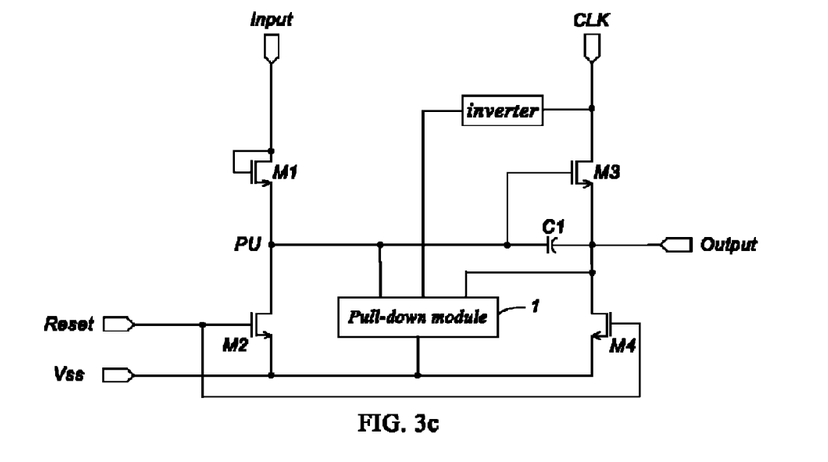
FIG. 3c is the schematic diagram of another implementation of the clock signal port in the shifting register as shown in FIG. 3.

It should be noted that, as shown in FIG. 3a, the clock signal port described in the present embodiment can include the first clock signal terminal CLK and the second clock signal terminal CLKB having signal level inverted to each other, when the signal input terminal Input is at high level, the first clock signal terminal CLK is at low level, and the second clock signal terminal CLKB is at high level, with the pull-down module 1 connected to the second clock signal terminal CLKB. However, it is not limited thereto. As shown in FIG. 3b, in another embodiment of the present invention, the clock signal port can include only the first clock signal terminal CLK as well, and the first clock signal terminal CLK is set to low level when the signal input terminal Input is at high level, and an inverter is connected between the first clock signal terminal CLK and the pull-down module 1. The inverter is used to invert the level of the signal sent from the first clock terminal CLK and output the inverted signal to the pull-down module 1, e.g., a signal at high level inverted by the inverter is transmitted to the pull-down module 1 when the signal sent by the first clock signal terminal CLK is at low level, whereas a signal at low level inverted by the inverter is transmitted to the pull-down module 1 when the signal sent by the first clock signal terminal CLK is at high level. Further, an inverter commonly used in the art can be employed as the inverter.

The work procedure of a shifting register of one embodiment of the present invention will be described below in connection with the shifting register shown in FIG. 4 and the input and output timing shown in FIG. 5, and the way of how to reduce the noise of the shifting register during the non-working period using the pull-down module 1 will be described in detail.

Figure 5:
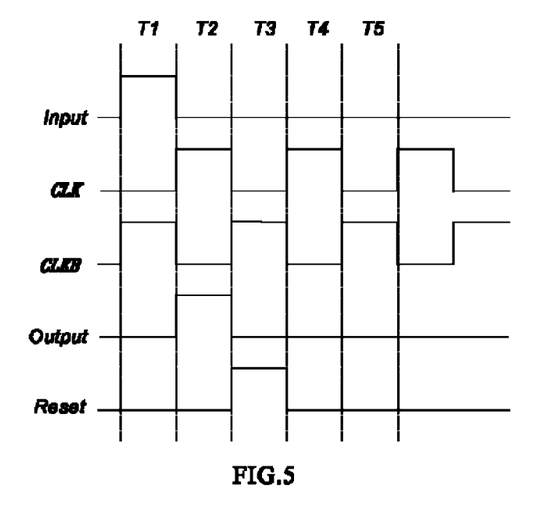
FIG. 5 is an input and output timing chart of the shifting register as shown in FIG. 4.

FIG. 5 illustrates the input and output timing chart of a shifting register of the present embodiment, wherein 5 phases T1 to T5 are selected. In the following description and throughout FIG. 6 to FIG. 10, 1 represents a high level signal, and 0 represents a low level signal. And throughout the following FIG. 6 to FIG. 10, an arrow represents the thin film transistor turns on, and a cross represents the thin film transistor turns off.

At phase T1, Input=1, CLK=0, CLKB=1, and Reset=0.

Figure 6:
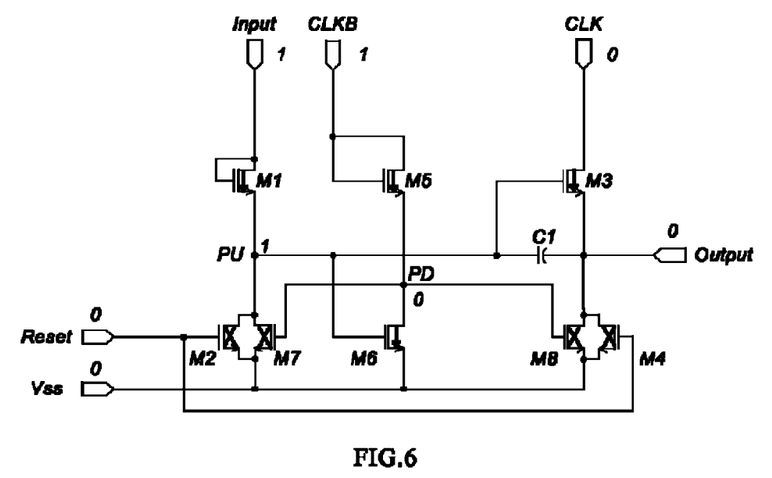
FIG. 6 is a working schematic diagram of the shifting register as shown in FIG. 4 at phase T1.

As shown in FIG. 6, since Input=1, the first thin film transistor M1 turns on and controls the shifting register to start to work, and the signal input terminal Input pulls the first node PU up with the first thin film transistor M1 and charges the storing capacitor C1. Since CLKB=1, the fifth thin film transistor M5 turns on, and pulls the second node PD up to high level. However, since the first node PU is pulled up, the sixth thin film transistor M6 turns on and pulls the second node PD down to low level Vss. In this way, it can remain the seventh thin film transistor M7 and the eighth thin film transistor M8 off, to prevent the seventh thin film transistor M7 from pulling the first node PU down to the low level Vss. Since the sixth thin film transistor M6 can pull the second node PD down when the fifth thin film transistor M5 pulls the second node PD up, the fifth thin film transistor M5 and the sixth thin film transistor M6 can form an inverter. The third thin film transistor M3 turns on when the first node PU is at high level; however, a low level is output at the signal output terminal Output since CLK=0. T1 stage is a charging stage for the storing capacitor C1 of the shifting register.

Figure 7:
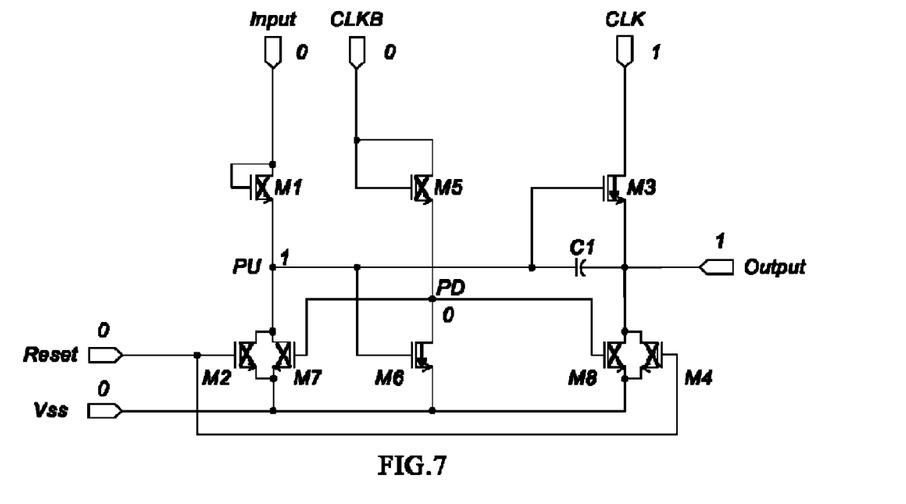
FIG. 7 is a working schematic diagram of the shifting register as shown in FIG. 4 at phase T2.

At phase T2, Input=0, CLK=1, CLKB=0, and Reset=0.

As shown in FIG. 7, since Input=0, the first thin film transistor M1 turns off, and the bootstrapping effect of the storing capacitor C1 further pulls up the first node PU. Since CLKB=0, the fifth thin film transistor M5 turns off, and the sixth thin film transistor M6 turns on and pulls the second node PD down to the low level Vss when the first node PU is pulled up, therefore the second node PD remains at low level. Since CLK=1, the third thin film transistor M3 turns on when the first node PU is at high level, and outputs high level of the first clock signal terminal CLK to the signal output terminal Output, and therefore the high level is output to a row of gate lines corresponding to the shifting register by the signal output terminal Output, so as to switch on all thin film transistors placed on the row of gate lines inside the display area of the LCD panel, and the data line starts to write the signal. Phase T2 is a phase in which the shifting register is switched on.

Figure 8:
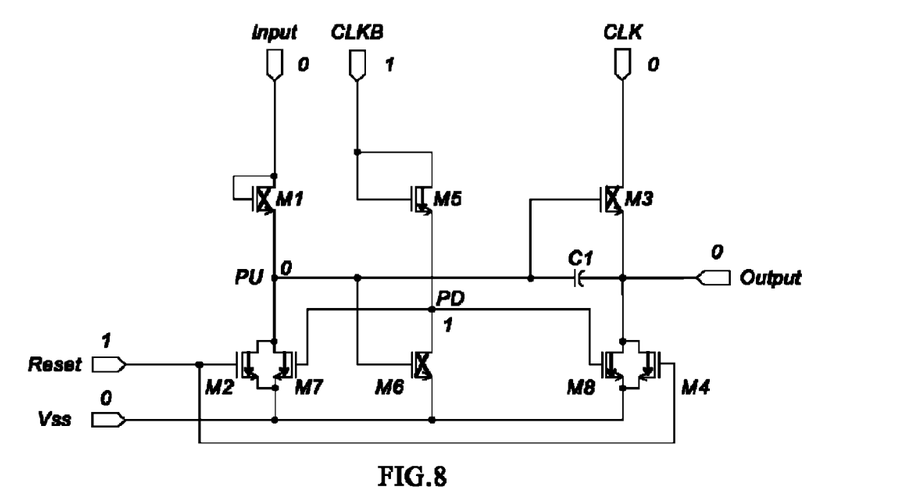
FIG. 8 is a working schematic diagram of the shifting register as shown in FIG. 4 at phase T3.

At phase T3, Input=0, CLK=0, CLKB=1, and Reset=1.

As shown in FIG. 8, since Reset=1, the second thin film transistor M2 and the fourth thin film transistor M4 turn on. The first node PU is pulled down to the low level Vss after the second thin film transistor M2 turns on, and the signal output terminal Output is pulled down to the low level Vss after the fourth thin film transistor M4 turns on, so that a low level is output from the signal output terminal Output. Furthermore, since CLKB=1, the fifth thin film transistor M5 turns on, and pulls the second node PD up (at this point, the first node PU is at low level, therefore the sixth thin film transistor M6 turns off). The seventh thin film transistor M7 and the eighth thin film transistor M8 turn on when the second node PD is at high level, the turning-on of the seventh thin film transistor M7 is able to pull the first node PU down to Vss, and the turning-on of the eighth thin film transistor M8 is able to pull the signal output terminal Output down to Vss. Since the seventh thin film transistor M7 and the eighth thin film transistor M8 can turn on simultaneously, and ultimately make the signal output terminal Output output a low level; when one of these two thin film transistors fails, the other one can still keep the signal output terminal Output to output a low level. This setting functions as a double insurance, and thus the signal output terminal Output is prevented from turning to high level due to the effects of other interfering signals, and from switching on a row of gate lines under its control due to the high level and ultimately causing a gate line to switch on in error.

Figure 9:
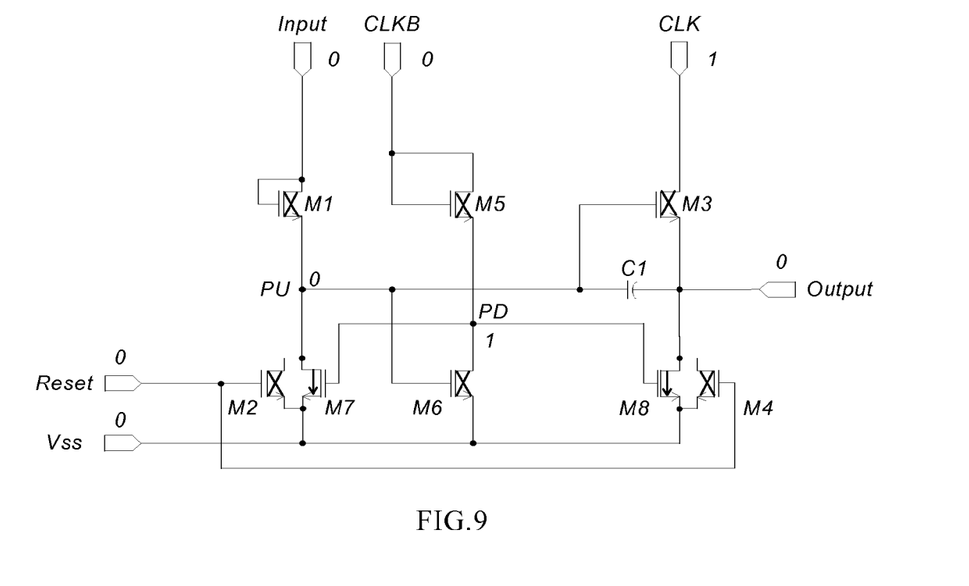
FIG. 9 is a working schematic diagram of the shifting register as shown in FIG. 4 at phase T4.

At phase T4, Input=0, CLK=1, CLKB=0, and Reset=0.

As shown in FIG. 9, since CLKB=0 and Reset=0, the fifth thin film transistor M5, the second thin film transistor M2 and the fourth thin film transistor M4 turn off, the second node PD remains at high level, and the seventh thin film transistor M7 and the eighth thin film transistor M8 turn on. The turning-on of the seventh thin film transistor M7 can pull the first node PU down to Vss, and the turning-on of the eighth thin film transistor M8 can pull the signal output terminal Output down to Vss, and thus the signal output terminal Output is prevented from turning to high level due to the effects of other interfering signals, and from switching on a row of gate lines under its control due to the high level and ultimately causing a gate line to switch on in error.

Figure 10:
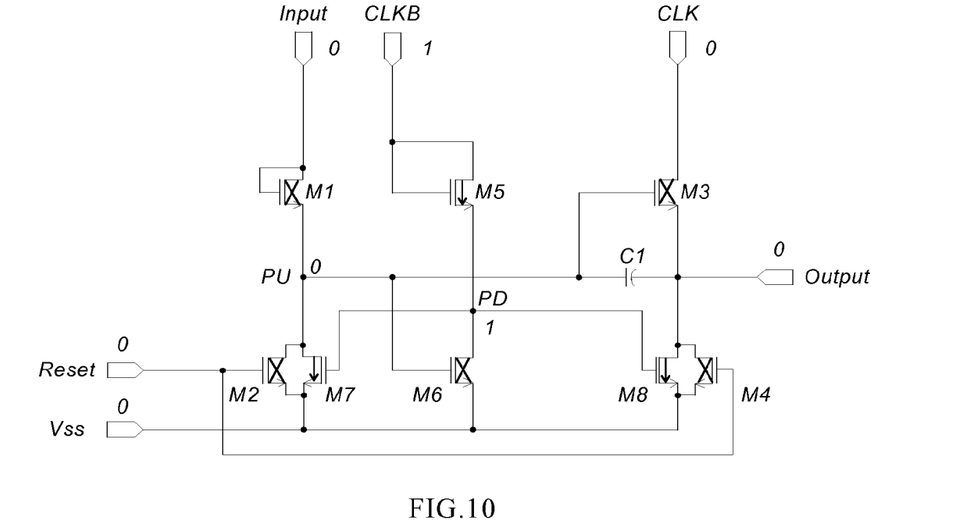
FIG. 10 is a working schematic diagram of the shifting register as shown in FIG. 4 at phase T5.

At phase T5, Input=0, CLK=0, CLKB=1, and Reset=0.

As shown in FIG. 10, since CLKB=1, the fifth thin film transistor M5 turns on, so that the second node PD remains at high level, and the seventh thin film transistor M7 and the eighth thin film transistor M8 remains on. The turning-on of the seventh thin film transistor M7 can pull the first node PU down to Vss, and the turning-on of the eighth thin film transistor M8 can pull the signal output terminal Output down to Vss, therefore the signal output terminal Output is prevented from turning to high level due to the effects of other interfering signals, and from switching on a row of gate lines under its control due to the high level and ultimately causing a gate line to switch on in error.

Thereafter until next time the signal input terminal Input is at high level, the shifting register repeats phases T4 and T5, and the period can be referred as the non-working period of the shifting register. And phases T1 to T3 can be referred as the working period of the shifting register. It can be known from the above description that, during the non-working period of the shifting register, the second node PD remains at high level, so that the seventh thin film transistor M7 and the eighth thin film transistor M8 remains on, therefore the first node PU and the signal output terminal Output remain at low level, and thus the noise of the shifting register during the non-working period can be reduced with the pull-down module 1.

It can be known from above that, the embodiment of the shifting register as shown in FIG. 4 is able not only to perform the function of a shifting register, but also to reduce noise. More importantly, only 8 thin film transistors and 1 storing capacitor are employed by the shifting register, and applying such a small number of thin film transistors and storing capacitor is able not only to reduce the space occupied by the shifting register, but also to optimize the wiring inside the shifting register or even the wiring inside the apparatus for driving gate lines, and to reduce the overlapping areas of the wirings and vias, therefore it is easier to realize a narrower frame design of the LCD panel.

Figure 11:
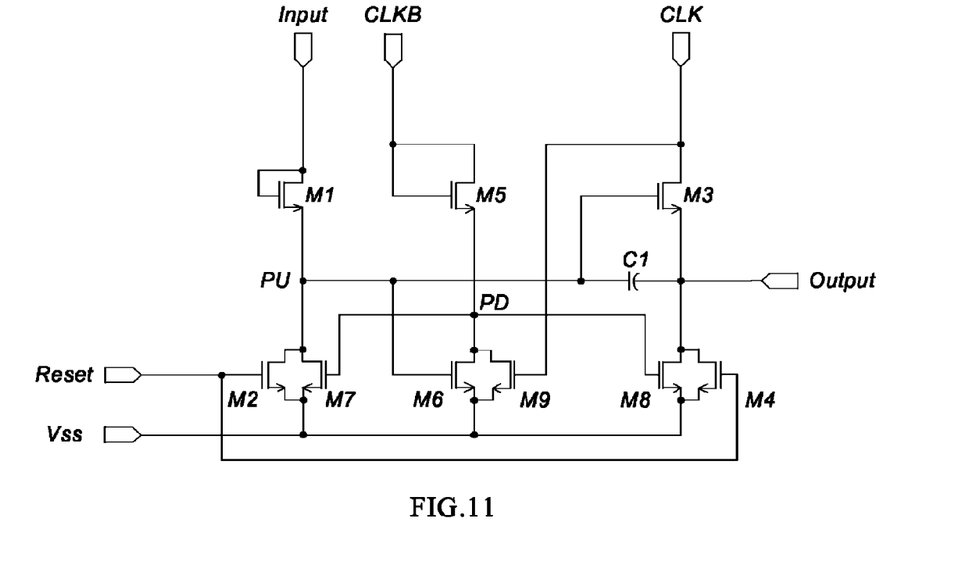
FIG. 11 is a schematic diagram of another detailed implementation of a shifting register of another embodiment of the present invention.

In addition, as in FIG. 11, another embodiment of a shifting register of the present invention is shown. The shifting register of the present embodiment is essentially the same as the shifting register as shown in FIG. 4, but they differ in that a ninth thin film transistor M9 is further included in the shifting register of the present embodiment, wherein the gate is connected to the first clock signal terminal CLK, the drain is connected to the second node PD, and the source is connected to the low level signal terminal Vss.

Phase T2 of the shifting register of the present embodiment differs from the phase T2 as described above. Other than the actions during the phase T2 as described above, during the phase T2 of the present embodiment, since CLK=1, the ninth thin film transistor M9 turns on, therefore the second node PD is pulled down to Vss, to prevent the seventh thin film transistor M7 and the eighth thin film transistor M8 which are controlled by the second node PD from turning on. It should be noted that, it can be known in connection with the phase T2 as described above that, during the phase T2 of the present embodiment, the sixth thin film transistor M6 and the ninth thin film transistor M9 can simultaneously turn on, and pulling the second node PD down to low level ultimately; therefore when one of these two thin film transistors fails, the other one can still keep the second node PD to remain at low level. This setting functions as a double insurance. Therefore the seventh thin film transistor M7 and the eighth thin film transistor M8 remain off when the second node PD remains at low level, and the first node PU and the signal output terminal Output are prevented from being pulled down, and ultimately assuring that a high level is output from the signal output terminal Output during phase T2.

Phase T1 of the shifting register of the present embodiment is the same as the phase T1 described above.

Phase T2 of the shifting register of the present embodiment differs from the phase T2 as described above. Other than the actions during the phase T2 as described above, during the phase T2 of the present embodiment, since CLK=1, the ninth thin film transistor M9 turns on, therefore the second node PD is pulled down to Vss, to prevent the seventh thin film transistor M7 and the eighth thin film transistor M8 which are controlled by the second node PD from turning on. It should be noted that, it can be known in connection of the phase T2 as described above that, during the phase T2 of the present embodiment, the sixth thin film transistor M6 and the ninth thin film transistor M9 can simultaneously turn on, and pulling the second node PD down to low level ultimately; therefore when one of these two thin film transistors fails, the other one can still keep the second node PD to remain at low level. This setting functions as a double insurance. Therefore the seventh thin film transistor M7 and the eighth thin film transistor M8 remain off when the second node PD remains at low level, and the first node PU and the signal output terminal Output are prevented from being pulled down, and ultimately assuring that a high level is output from the signal output terminal Output during phase T2.

Phase T3 of the shifting register of the present embodiment is the same as the phase T3 described above.

Phase T4 of the shifting register of the present embodiment differs from the phase T4 as described above. Other than the actions during the phase T4 as described above, during phase T4 of the present embodiment, since CLK=1, the ninth thin film transistor M9 turns on, therefore the second node PD is pulled down to the low level Vss, to prevent the seventh thin film transistor M7 and the eighth thin film transistor M8 which are controlled by the second node PD from turning on.

Phase T5 of the shifting register of the present embodiment is the same as the phase T5 described above.

Figure 12:
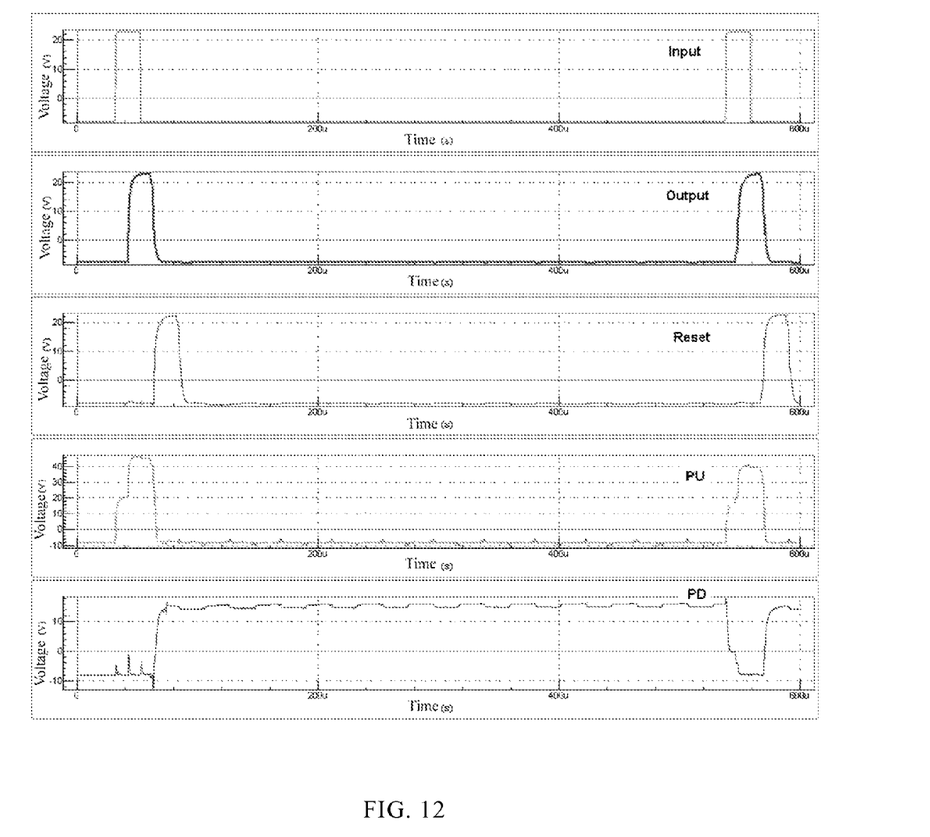
FIG. 12 is a schematic diagram of the circuit simulation result of the shifting register as shown in FIG. 4.

It can be known from the above description that, as in FIG. 12, the schematic diagram of the circuit simulation results of the shifting register in FIG. 4 is shown. During the non-working period as shown in FIG. 4, the second node PD remains at high level all the time with a duty ratio of as high as 100%, so that the seventh thin film transistor M7 and the eighth thin film transistor M8 remain on-state all the time. Such a long on-state duration requires applying voltage to the seventh thin film transistor M7 and the eighth thin film transistor M8 all the time, therefore threshold voltage offsets of the seventh thin film transistor M7 and the eighth thin film transistor M8 are likely to occur, and ultimately results in the seventh thin film transistor M7 and the eighth thin film transistor M8 cannot be switched on and thus affect the life-span of the shifting register.

Figure 13:
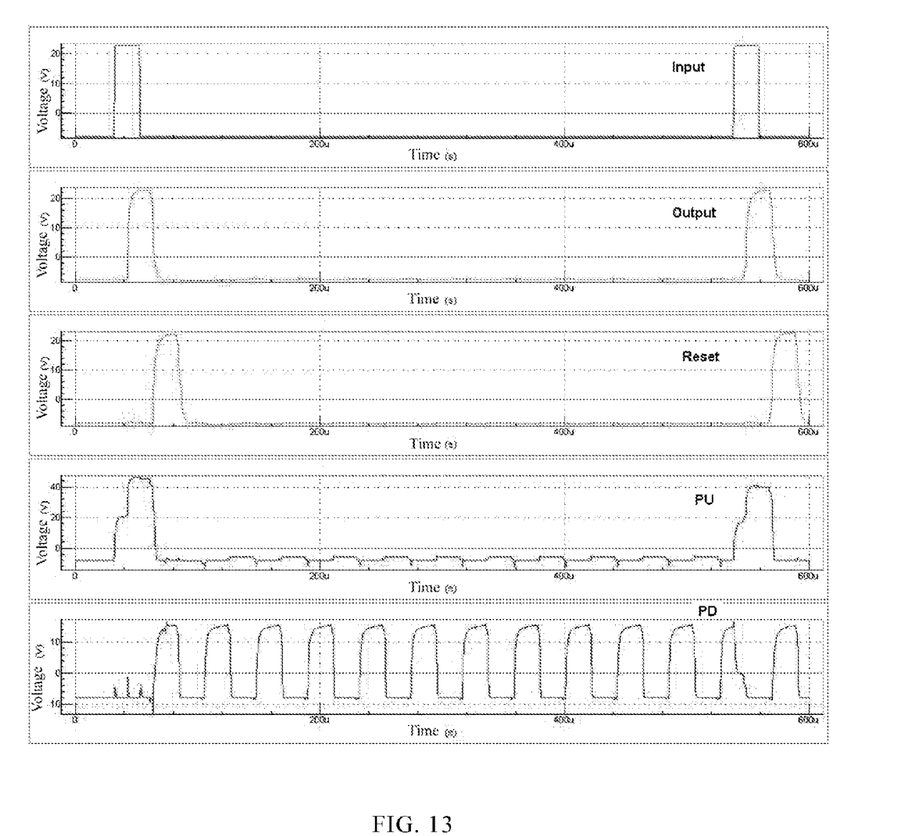

As in FIG. 13, the schematic diagram of circuit simulation results of the shifting register shown in FIG. 11 is shown. During the non-working period of the shifting register as shown in FIG. 11, the second node PD remains at low level during the repeating phase T4, and remains at high level only during the repeating phase T5, therefore the duty ratio is approximately 50%. In this way, it prevents the seventh thin film transistor M7 and the eighth thin film transistor M8 from keeping in on-state all the time, therefore the threshold voltage offsets of the seventh thin film transistor M7 and the eighth thin film transistor M8 are reduced, so that the shifting register has a longer life-span.

Figure 14:
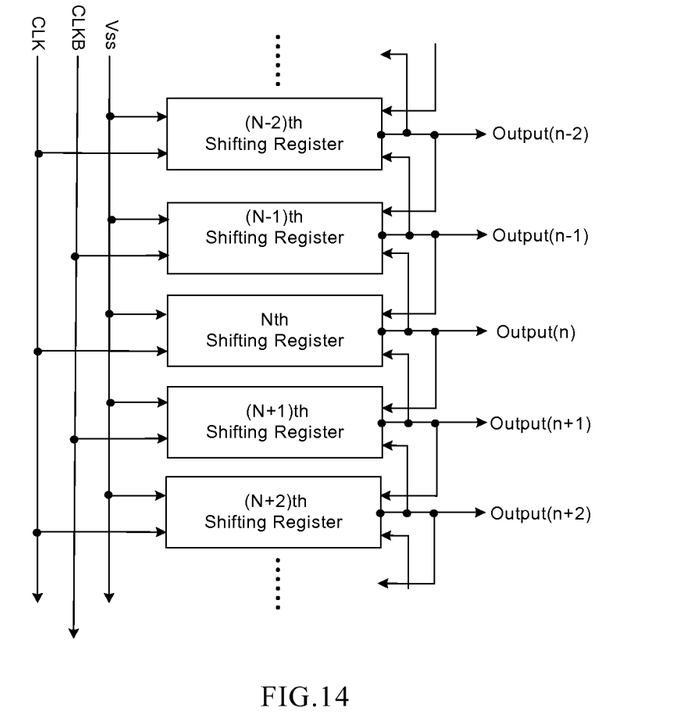
FIG. 14 shows a schematic diagram of an apparatus for driving gate lines according to an embodiment of the present invention.

Other than the above, an apparatus for driving gate lines is also provided by an embodiment of the present invention. As shown in FIG. 14, the apparatus for driving gate lines includes a plurality of shifting registers in serial. Except for the first shifting register and the last shifting register, each of the rest shifting registers inputs a trigger signal to the signal input terminal of the shifting register immediately subsequent to it, and inputs a reset signal to the reset signal terminal of the shifting register immediately preceding to it.

It should be noted that, with the embodiments of shifting register as shown in FIG. 4 and FIG. 11, in actual use, the technical approach described above is not only applicable to hydrogenated amorphous silicon thin film transistors, but also applicable to other types of thin film transistors. It should also be noted that, the source and the drain of thin film transistors used in the shifting register embodiments as shown in FIG. 4 and FIG. 11 described above are symmetrical to each other.

Other than the above, an apparatus for driving gate lines is also provided by an embodiment of the present invention. As shown in FIG. 14, the apparatus for driving gate lines includes a plurality of shifting registers in serial. Except for the first shifting register and the last shifting register, each of the rest shifting registers inputs a trigger signal to the signal input terminal of the shifting register immediately next to it, and inputs a reset signal to the reset signal terminal of the shifting register immediately preceding to it.

For the sake of convenience, only 5 shifting registers are shown in FIG. 14, which are respectively a shifting register at the (N−2)th stage, a shifting register at the (N−1)th stage, a shifting register at the Nth stage, a shifting register at the (N+1)th stage and a shifting register at the (N+2)th stage; wherein, the output (n) of the shifting register at the Nth stage not only feeds back to the shifting register at the (N−1)th stage to turn off the same, while outputs to the shifting register at the (N+1)th stage a trigger signal for the shifting register at the (N+1)th stage.

Referring to FIG. 3, the shifting register of the present embodiment includes 4 thin film transistors, 1 storing capacitor, 1 pull-down module and the corresponding input and output terminals. It comprises the following in details: a first thin film transistor M1, with the gate and the drain connected together to a signal input terminal Input, and the source connected to a first node PU which is a pull-up node, operates to control the shifting register to start to work when receiving a high level signal sent from the signal input terminal Input; a second thin film transistor M2, with the gate connected to a reset signal terminal Reset, the drain connected to the first node PU, and the source connected to a low level signal terminal Vss, operates to turn on when receiving a high level input from the reset signal terminal Reset, so as to pull down the first node PU to low level Vss, to prevent a third thin film transistor M3 from turning on in error; the third thin film transistor M3, with the gate connected to the first node PU, the drain connected to a clock signal port, and the source connected to the signal output terminal Output, operates to transmit a high level of the clock signal port to the signal output terminal Output after turning on, to drive a row of gate lines corresponding to the shifting register to switch on with the high level of the signal output terminal Output; a fourth thin film transistor M4, with the gate connected to the reset signal terminal Reset, the drain connected to the signal output terminal Output, and the source connected to the low level signal terminal Vss, operates to turn on when receiving a high level input from the reset signal terminal Reset, so as to pull down the signal output terminal Output to the low level Vss, to prevent the shifting register from outputting a high level in error during the resetting phase; a capacitor C1, connected between the first node PU and the signal output terminal Output, forms a storing capacitor; a pull-down module 1, connected among the clock signal port, the first node PU and the signal output terminal Output, and connected to the low level signal terminal Vss, maintains the first node PU and the signal output terminal Output to be at low level during the non-working period of the shifting register.

With the shifting register provided in embodiments of the present invention, since the pull-down module 1 is connected among the clock signal port, the first node PU and the signal output terminal Output, and further is connected to the low level signal terminal Vss, to maintain the first node PU and the signal output terminal Output to be at low level during the non-working period of the shifting register, it is able to prevent the first node PU and the signal output terminal Output from being in floating state. As such, the parasitic capacitance of the third thin film transistor M3 will not cause the leak current to increase when the clock signal port is at high level, therefore the noise of the shifting register during the non-working period is reduced.

It should be noted that, the shifting registers employed by the apparatus for driving gate lines of the embodiments are the same as those employed by the shifting register of the embodiments described above in terms of functionality and structure, and thus can solve the same technical problem and achieve the same predicted technical effects.

What have been described above are only detailed implementations of the present invention, and the protection scope of the present invention is not limited thereto. Any skill person in the art can readily conceive modifications or alterations based on the technical scope disclosed in the present invention, and such modifications or alterations should be covered by the claimed scope of the present invention. Therefore, the protection scope of the present invention should be defined by the following claims.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A shifting register, comprising:
   a first thin film transistor, having the gate and the drain connected together to a signal input terminal, and the source connected to a first node which is a pull-up node;
   a second thin film transistor, having the gate connected to a reset signal terminal, the drain connected to the first node, and the source connected to a low level signal terminal;
   a third thin film transistor, having the gate connected to the first node, the drain directly connected to a clock signal port, and the source connected to a signal output terminal;
   a fourth thin film transistor, having the gate connected to the reset signal terminal, the drain connected to the signal output terminal, and the source connected to the low level signal terminal;
   a capacitor, being connected between the first node and the signal output terminal;
   a pull-down module, being connected among the clock signal port, the first node and the signal output terminal, and further connected to the low level signal terminal, for maintaining the first node and the signal output terminal to be at low level during a nonworking period of the shifting register;
   wherein the pull-down module comprises:
      a fifth thin film transistor, having a gate and a drain connected together to the clock signal port, and a source connected to a second node which is a pull-down node;
      a sixth thin film transistor, having a gate connected to the first node, a drain connected to the second node, and a source connected to the low level signal terminal;
      a seventh thin film transistor, having a gate connected to the second node, a drain connected to the first node, and a source connected to the low level signal terminal; and
      an eighth thin film transistor, having a gate connected to the second node, a drain connected to the signal output terminal, and a source connected to the low level signal terminal; and
   wherein the shifting register further comprises:
      a ninth thin film transistor, having a gate directly connected to the drain of the third thin film transistor, a drain connected to the second node, and a source connected to the low level signal terminal.

2. The shifting register of claim 1, wherein the clock signal port comprises a first clock signal terminal and a second clock signal terminal having signal level inverted to each other, and the first clock signal terminal being at low level when the signal input terminal is at high level;
   wherein, the pull-down module is connected to the second clock signal terminal, the drain of the third thin film transistor is connected to the first clock signal terminal.

3. The shifting register of claim 2, wherein
   the gate and the drain of the fifth thin film transistor are connected together to the second clock signal terminal.

4. The shifting register of claim 1, wherein
   the clock signal port comprises a first clock signal terminal, the first clock signal terminal being at low level when the signal input terminal is at high level; an inverter is connected between the first clock signal terminal and the pull-down module, and the drain of the third thin film transistor is connected to the first clock signal terminal.

5. The shifting register of claim 4, wherein,
   the gate and the drain of the fifth thin film transistor are connected together to the inverter.

6. An apparatus for driving gate lines, comprising a plurality of the shifting registers according to claim 1 connected serially, wherein except for a first shifting register and a last shifting register, each of the remaining shifting registers inputs an input trigger signal to the signal input terminal of a shifting register immediately subsequent it, and inputs a reset signal to the reset signal terminal of a shifting register immediately previous to it.

* * * * *